United States Patent [19]

Jamieson et al.

[11] Patent Number: 4,845,373

[45] Date of Patent: Jul. 4, 1989

[54] AUTOMATIC ALIGNMENT APPARATUS HAVING LOW AND HIGH RESOLUTION OPTICS FOR COARSE AND FINE ADJUSTING

[75] Inventors: John Jamieson, Los Gatos; May M. Hsu, Fremont, both of Calif.

[73] Assignee: KLA Instruments Corporation, Santa Clara, Calif.

[21] Appl. No.: 899,992

[22] Filed: Aug. 25, 1986

Related U.S. Application Data

[63] Continuation of Ser. No. 582,590, Feb. 22, 1984, abandoned.

[51] Int. Cl.$^4$ .................... G01N 21/86; G01B 11/00
[52] U.S. Cl. ..................................... 250/548; 356/400
[58] Field of Search .................. 250/548, 557, 561; 356/400, 401; 358/106; 364/507, 559; 350/612

[56] References Cited

U.S. PATENT DOCUMENTS

| | | | |
|---|---|---|---|
| 3,950,712 | 4/1976 | Chenausky et al. | 331/94.5 C |
| 4,171,162 | 10/1979 | Gerard et al. | 356/401 |
| 4,213,117 | 7/1980 | Kembo et al. | 340/146.3 H |
| 4,328,553 | 5/1982 | Fredriksen et al. | 364/559 |
| 4,437,758 | 3/1984 | Suzuki | 356/401 |
| 4,477,185 | 10/1984 | Berger et al. | 250/557 |
| 4,492,459 | 1/1985 | Omata | 355/43 |
| 4,531,060 | 7/1985 | Suwa et al. | 250/548 |
| 4,575,250 | 3/1986 | Suzuki | 250/557 |
| 4,614,432 | 9/1986 | Kuniyoshi et al. | 356/401 |

FOREIGN PATENT DOCUMENTS

0016984 2/1979 Japan .................. 250/548

Primary Examiner—David C. Nelms
Assistant Examiner—William L. Oen
Attorney, Agent, or Firm—Rosenblum, Parish & Bacigalupi

[57] ABSTRACT

An optico-mechanical alignment apparatus having at least two optical paths, one with low resolution and one with high resolution providing an image to video image generator. The image forms a first data set that is compared to a second data set representative of the preferred alignment of an object to be aligned by a comparison means that can automatically move a stage mounting the object to be aligned in the X, Y and Z directions and rotate it in the X Y plane. The object is coarsely aligned with the low resolution optics and then finely aligned with the high resolution optics.

8 Claims, 3 Drawing Sheets

AUTOMATIC ALIGNMENT APPARATUS HAVING LOW AND HIGH RESOLUTION OPTICS FOR COARSE AND FINE ADJUSTING

This is a continuation of the application Ser. No. 582,590, filed 2/22/4, now abandoned.

BACKGROUND OF THE INVENTION

1. Field of the Invention

This invention relates to apparatus for automatically aligning objects. In particular, this invention relates to opto-mechanical apparatus for automatically aligning patterned silicon wafers and the like placed on a movable stage.

2. Description of the Prior Art

Integrated circuit chips or dice are manufactured by etching a plurality of circuits on a single large, substantially round substrate wafer made of semiconductor material. The plurality of circuits, each of which will later form a chip, are arrayed on the wafer in a rectalinear fashion with "streets" between adjacent circuits. At various points in the manufacture of the chips, the uncut partially finished wafers must be precisely aligned for probing, testing and the like. If this alignment process is automated, more wafers can be tested in a given period of time, and if the alignment is routinely more accurate, the yield of usable chips can be improved.

The field of pattern recognition has wide applications in industry. With the advent of photoelectric devices capable of generating electrical signals in response to optically detected objects, it has become possible to generate automatic devices for industrial use that detect and recognize objects.

One particular application for pattern recognition is in instruments that optically detect particular circuit elements or flaws in the production and quality control of photomasks and patterned silicon wafers. Two such instruments are shown in U.S. Pat. Nos. 4,347,001, and 4,247,203 both issued to Levy, et al., and relate to automatic photomask inspection systems and apparatus. Silicon wafers and the photomasks used to make silicon wafers generally have the same pattern repeated many times in a rectilinear array. The automatic photomask inspection system compares equivalent portions of two different dice on one photomask in two simultaneous scans. One problem with an apparatus like this is aligning the photomask or patterned silicon wafer precisely so that the two optical inspection paths are in fact inspecting equivalent portions of two different dice. A similar problem exists in wafer probers that perform electrical tests on wafers. Wafer probers employ fine conductive probes making contact with specific points on dice. This procedure demands extremely acurate alignment of wafers.

U.S. Pat. No. 4,200,861 and its divisional application, now U.S. Pat. No. 4,385,322, both issued to Hubach et al, teach a method and system for recognizing patterns. The location coordinates in the X and Y dimension for a match is determined at the location of the highest correlation number. A fine search is then made around the course location by comparing previously stored information in real time with information from the scene under investigation. No specific optics are given, and there is no suggestion of two separate low resolution data gathering scans at widely separated locations.

U.S. Pat. No. 4,300,164, issued to Sacks, teaches a pattern recognition system. A high contrast video signal is generated and patterns are recognized as combinations of black and white. Again, although this patent teaches comparison techniques and software, there is no specific teaching of the preferred optics.

SUMMARY OF THE PRESENT INVENTION

It is an object of this invention to provide an apparatus that will automatically align a silicon wafer or photomask in a manner that will reduce the time normally required to mount and align a wafer to be tested for defects.

It is another object of this invention to provide optics that produce multiple images of the silicon wafer thereby minimizing movement in the alignment process.

Another object of this invention is to provide two images, separated as widely as possible, thereby maximizing alignment accuracy.

Another object of this invention is to provide optics that can change image magnification allowing increased resolution of the wafer under inspection thereby improving alignment of the wafer.

These and other advantages will become apparent to those skilled in the art upon reading the attached specification.

The present invention provides an optomechanical apparatus for aligning patterned silicon wafers or the like comprising a stage translatable in the X, Y and Z directions and rotatable in the X, Y plane. The apparatus includes a first optical path having an illumination source and focusing means having low resolution, and a second optical path having an illumination source and focusing means having high resolution. Means for selecting the image formed by the first optical path or the second optical path is provided. The focused image is processed by an optical detector capable of converting the selected optical image into a first data set of digital pixel elements. In one embodiment data base means is provided having stored therein a second data set representative of a preferred alignment of the object to be aligned. A comparison means is provided for comparing the first and second data sets and for developing correction control signals which are used to drive the stage to align the silicon wafer at a low resolution and then repeat the operation using the high resolution image.

DETAILED DESCRIPTION OF THE PREFERRED EMBODIMENTS

Figure 1:
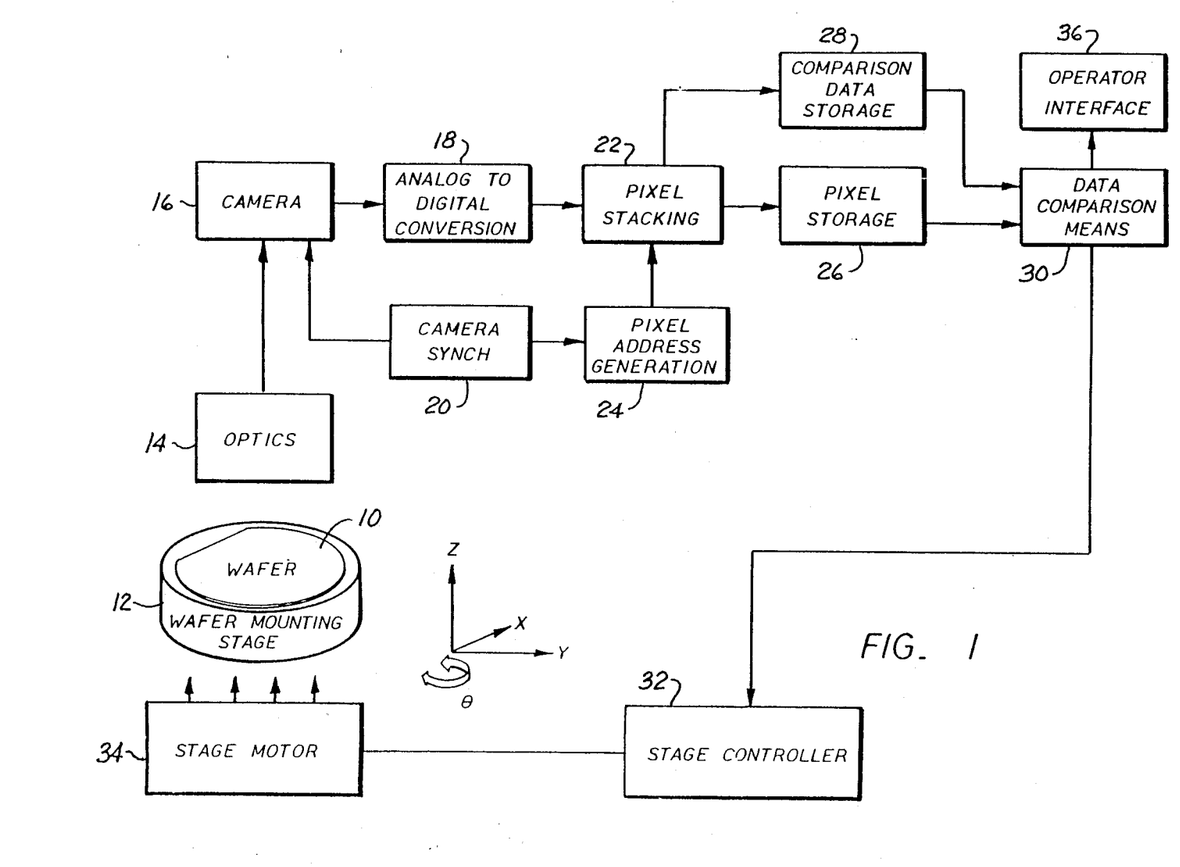
FIG. 1 shows an overall schematic diagram of the present invention.

Referring to FIG. 1, an unaligned wafer 10 is shown mounted on a movable stage 12 forming a part of a wafer handling or processing system (not shown). The stage can translate in any of the three directions, X, Y or Z and can rotate in the direction O in the X, Y plane. Preferably, a series of wafers are randomly loaded in a magazine (not shown) and fed one at a time onto the stage 12 to be correctly oriented. A wafer is typically loaded with a random orientation on the stage. The loaded wafer is then aligned and subsequently has any of a series of operations performed on it, including, testing, photomask alignment, and the like.

To align the wafer relative to the system, an image of the wafer is formed by the optics 14. Preferably, the optics 14 generates images in pairs, with each image being taken from a widely separated point on the surface of the wafer 10. As described in further detail below, the optics of this invention include both a low resolution macro lens and a high resolution micro lens to achieve precision alignment. In an alternative embodiment, at least two of each type of lens are used, thereby providing two images of the wafer from each of substantially different regions of its surface. If two lens systems are used, the stage need not be moved to provide the multiple images required for high precision alignment.

The images are taken or "grabbed" by a video camera 16 or the like. Although video cameras are the currently preferred mode, any means that can generate an electronic signal representative of an image, either analog or digital inform could be successfully used. If conventional video cameras are used, the analog signal produced is digitized by conventional analog-to-digital conversion means 18.

It has been found that an image having 4-bit pixels, which correspond to 16 grey levels, is entirely satisfactory to accurately align silicon wafers. To more efficiently store the 4-bit pixels, it is preferred that they be stacked (as indicated at 22) so that two or four pixels are stored at every addressable location (generated at 24) in the RAM 26.

The camera synchronization means 20 synchronizes the video camera with the system. The pixels are assigned addressable locations as each one is received. In a preferred embodiment of this invention, the two functions are combined, thereby reducing the number of counters required by the overall system.

In one preferred embodiment, the first wafer provides not only the data of an unaligned wafer, but also provides the comparison or reference data that is stored in a memory 28 and subsequently compared (by a means 30) to data data obtained from each succeeding wafer. Conceptually, it is possible that the comparison data could be obtained from a source external to the system and loaded onto the system for each wafer type examined.

An alternative approach is to have the system align the first wafer by extensive calculations, and place the correct alignment date into Random Access Memory (RAM) 28. This data is then used as the comparison data. The comparison data and the pixel storage are preferably stored in the same physical RAM.

The data comparison means 30, the pixel data storage means 26, and the comparison data storage means 28 are preferably embodied in a micro-processor with a program stored in Read Only Memory (ROM) which generates signals that activate the stage controller 32 and switch the optics from low resolution to high resolution. The stage controller 32 is a separate micro-processor that controls the stage motors and moves the mounted but unaligned wafer into more accurate alignment by precision actuation of the stage motors 34.

Depending on how poorly aligned the wafer was initially, and the desired precision of alignment, the alignment process may take several iterations of determining how to align the wafer and then moving it. Once the wafer is aligned precisely enough for the purpose needed, the stage is moved laterally to an operational station for wafer testing or the like. The stage then moves the tested wafer back to a position where it is unloaded and the next unaligned wafer is placed on the stage.

An operator interface 36 allows operative control of the machine. Other similar interfaces (not shown) can allow the machine to be operated in conjunction with other machines that may be needed for testing and the like.

In accordance with the present invention two selectable optical paths having different resolutions allow the wafer to be aligned in a sequence of steps. First, the wafer is coarsely aligned by orienting the flat edge normally found on silicon wafer perimeters. The practice in the industry is that the flat is aligned to within about 5 degrees of the pattern on the wafer. The first optical path, a low resolution path, can be used to initially scan the edge of the wafer as it is rotated to find the flat and effect coarse alignment. Thereafter, in accordance with the present invention the patterns on the wafer, are scanned twice; once using a low resolution optical path and once using a high resolution optical path to accomplish precision alignment of the patterns. Although the low resolution image and the high resolution image could both be taken from concentric areas of the object surface, physical separation of the two images maximizes alignment accuracy.

After low resolution alignment has been completed, the beam path selector is caused to select the second optical 42 path having high resolution. This second optical path can be focused on individual die. The fine pattern structures of the die are used to finely align the wafer with respect to the features on individual dies.

The wafer is thus normally aligned in three steps. First, the wafer is oriented by its flat either mechanically or optically using the low resolution optical path. Second, the low resolution optical path is used to align the pattern of the dice on the wafer relative to a preference pattern. And finally, the fine pattern structures on individual dice are aligned relative to a reference using the second high resolution optical path.

Figure 2:
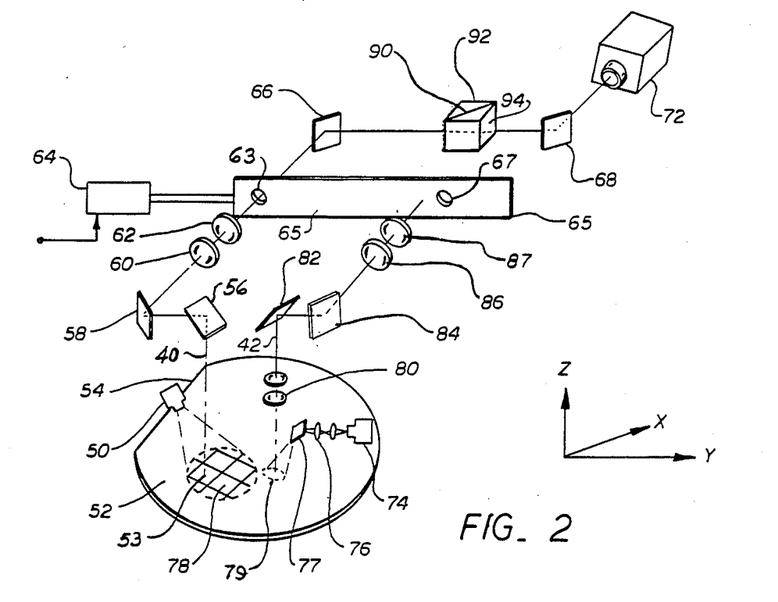
FIG. 2 shows a schematic view of the optics of a first embodiment of the present invention.

Referring now to FIG. 2 of the drawing, a first embodiment of a selectable two resolution optical system is illustrated which includes a first optical path 40 and a second optical path 42. A light source 50 is provided to illuminate a first portion of the wafer 52 to be aligned, the illuminated area being within the field of view of the optical system disposed along the optical axis 40. The field of view of the low resolution optical system is wide enough to include the edge of the wafer 52 so that the flat 54 can be used to coarse align the wafer.

During low resolution alignment light reflected from the illuminated surface portion 53 is reflected along the optical path 40 which includes a series of mirrors 56 and 58 and a first low resolution focusing means 60 and 62. The optical path then passes through an aperture 63 in a shutter 65 which is movable by an actuator 64 and can be caused by an appropriate input signal to select either one of the two optical paths. Note that shutter 65 also includes a second aperture 67. Finally, the focused beam is reflected through a series of mirrors 66, 68 and 70 to a vidicon tube 72 of the type which would be included in the camera 16 of FIG. 1. The video signal generated is digitized and the resolution pixels are used to provide data for the comparison means.

A second illumination source 74 provides a beam of light which is focused by a second focusing means 76 and reflected onto a second portion of the wafer by a small mirror 77. The light reflected from thew after at surface portion 79 is collected by a lens means 80, reflected by mirrors 82 and 84, and focused by a high resolution focusing means 86 and 87, all of which form the second optical axis 42. The image obtained at an image plane is a high resolution image of the portion 79 of the wafer. Although the drawing shows the first optical path 40 selected, the second optical path 42 can be selected in response to a control signal applied to actuator 64 which causes the shutter mechanism 65 to align aperture 67 with axis 42. When selected, the optical path 42 passes through aperture 67 and is reflected by a beam selector 70, which is comprised of two right prisms 92 and 94 joined on their long sides, at least one of which is half silvered. The selected image is then reflected by mirror 68 and focused onto the image plane of the vidicon tube 72.

By use of this apparatus, one low resolution optical path and one high resolution optical path are provided. Because the images are taken from different parts of the wafer the stage and the wafer mounted thereon need not be moved to obtain two separated images for precise alignment.

Figure 3:
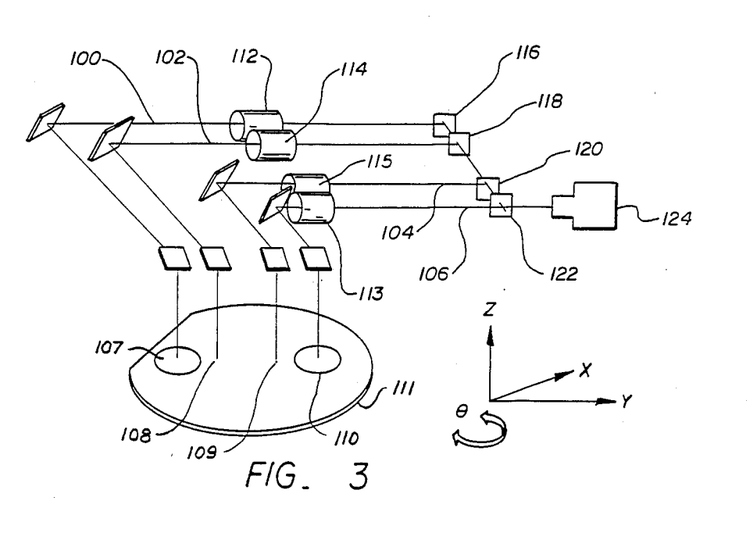
FIG. 3 shows a schematic view of the optics of a second embodiment of the present invention.

With reference to FIG. 3, another embodiment of the present invention is illustrated which has a first optical path 100, a second optical path 102, a third optical path 104 and a fourth optical path 106. The optical paths are similar to those of FIG. 2 except that the first and fourth optical paths form low resolution images and the second and third optical paths form high resolution images.

Illuminated spots 107, 108, 109 and 110 on a wafer 111 are respectively reflected to focusing means 112, 113, 114 and 115. Two of the means (112 and 113) are identical and form a low resolution image and the other two (114 and 115) are also identical and form a high resolution image. One of the three mirrors 116, 118 and 120 reflects the image formed by the optical path chosen onto a fourth mirror 112 which reflects the image into the vidicon tube 124 connected to the comparison means 30 (See FIG. 1). The fourth mirror 122 flips out of the way if the second low resolution optical path 106 has been chosen for analysis. The wafer is aligned coarsely by use of the low resolution images and then finely by use of the high resolution images. In this embodiment, in order to provide two sets of two images, form optical paths are proved, and a different optical path of the same resolution is selected for comparison to the other. The two low resolution optical paths and the two high resolution optical paths are separated widely to gain high alignment precision. The same pixel information is generated as in the previous embodiment. The comparison means can compare the first data set generated to the stored second data set. In this embodiment, the stage moves only to align the wafer.

Figure 4:
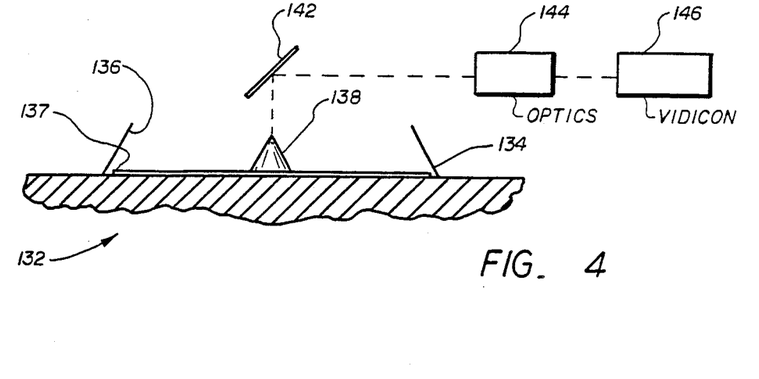
FIG. 4 shows a cut away view of a peripheral reflector of the present invention.

An alternative for aligning a wafer includes an optical means having a peripheral alignment mirror 134 and a cone mirror 138. Referring to FIG. 4, a patterned wafer 137 to be aligned is shown resting on stage 132. The peripheral alignment mirror 134 is positioned over it. The mirror is circular in shape having a slightly greater base diameter than the wafer to be inspected. The sides of the outer mirror are inclined over the periphery of the wafer. The interior sides 136 are a reflectively polished surface to reflect an image of the periphery of the wafer to the inners cone mirror 138. The cone mirror has a reflectively polished outer surface and reflects the image of the periphery of the wafer to a flat mirror 142 and then through optics 144 (not shown in detail—See FIG. 2 and 3) to the vidicon camera 146. Although the image of the periphery is distorted, (FIG. 6) the region of the peripheral flat can be easily determined. A comparison means can then automatically and rapidly rotate the stage (which has a randomly placed wafer on it) to a predetermined best position for finer alignment steps.

Figure 5:
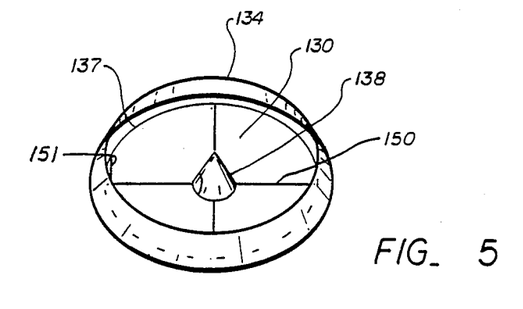
FIG. 5 shows a perspective view of a peripheral reflector of the present invention.

Referring to FIG. 5, the outer mirror 134 is shown inwardly included with a mirrored surface over the periphery of the patterned wafer 137 to be tested. An inner cone mirror 138 having an inclined surface that is substantially parallel to the outer mirror's inclined surface is mounted coaxially with the ring and held in place by fine wires 150.

Figure 6:
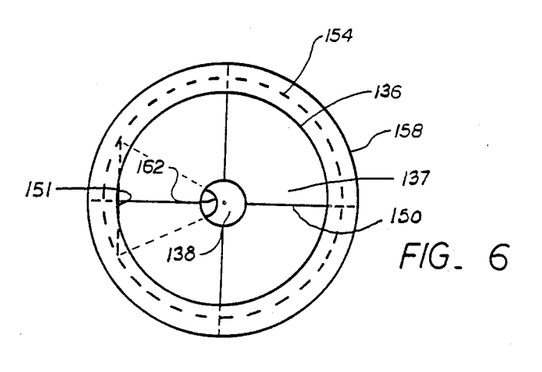
FIG. 6 shows an overhead view along the axis of a peripheral reflector of the present invention.

In FIG. 6, the patterned wafer 137 is again shown placed beneath the outer mirror 134. The inward edge 136 of the outer mirror hangs well over the perimeter of the waver 132. The cone 138 shows the reflected image of the perimeter of the wafer 132. The cone 138 shows the reflected image of the flat (151) which is disposed beneath the outer mirror. The semicircular line 162 in the image corresponds to the flat of the wafer. The gross alignment of the flat edge of the wafer can be made by reference to the image in the coaxial mounted cone alone.

As will be clear to those skilled in the art, alterations and modifications may be made to the disclosed embodiment without departing from the inventive concepts thereof. The above description is therefore intended as illustrative and informative, but not limiting in scope. Accordingly, it is intended that the following claims be interpreted as covering all such alterations and modifications that reasonably fall within the true spirit and cope of the invention.

What is claimed is:

1. A alignment apparatus comprising.
   A stage for mounting an object to be aligned, said stage automatically translatable in the X, Y and Z directions and automatically rotatable in the X, Y plane;
   a first optical path having an illumination source and focusing means having low resolution forming a first optical image;
   a second optical path having an illumination source and focusing means having high resolution forming a second optical image;
   means of selecting one of said first or said second optical paths;
   optical detector means capable of converting the selected optical image into a first data of digital pixel elements;
   data base means having stored thereon second data representative of preferred alignment of the object to be aligned mounted on said stage;
   comparison means for comparing said first data and second data; and
   alignment correction means activated by said comparison means to move said movable stage, thereby aligning said object to be aligned.

2. The apparatus of claim 1 wherein said object to be aligned is an patterned silicon wafer.

3. The apparatus of claim 2 wherein the patterned silicon wafer has a plurality of dice etched upon its surface and flat portion upon its peripheral edge.

4. The apparatus of claim 3 wherein said stage is movable a precise predetermined distance thereby providing at least two different areas scanned and at least two sets of first data for said first and second optical paths.

5. The alignment apparatus of claim 1 wherein said selection means selects at first optical path thereby coarsely aligning the object to be aligned and then selects said second optical path thereby finely aligning the object to be aligned.

6. The apparatus of claim 4 including a third optical path having an illumination source and focusing means having a low resolution forming a third image and a fourth optical path having an illumination source and focusing means having high resolution forming a fourth image, said first and said third focusing means being substantially identical and said second and said fourth focusing means being substantially identical.

7. The apparatus of claim 1 wherein said selection means selects said first optical path then said third optical path thereby coarsely aligning the object to be aligned, then said selector means selects said second optical path and then said fourth optical path thereby finely aligning the object to be aligned.

8. The alignment apparatus of claim 3 or claim 6 wherein said movable stage includes a mounting for said wafer having an outer circular ring member inclined inwardly over the edge of said wafer, said incline reflectively polished and an inner coaxial cone member having its inclined surface parallel to said inclined surface of said ring member having its outer surface, reflecting polished, said outer ring and said cone being of such orientation that the peripheral edge of said wafer is reflected up from said cone allowing determination of the location of said wafer flat with one optical image of the cone.

* * * * *

UNITED STATES PATENT AND TRADEMARK OFFICE
CERTIFICATE OF CORRECTION

PATENT NO. : 4,845,373
DATED : July 4, 1989
INVENTOR(S) : J. Jameison, M. Hsu

It is certified that error appears in the above—identified patent and that said Letters Patent is hereby corrected as shown below:

Column 6;

IN THE CLAIMS

Cancel claims 1-8 of the issued patent and substitute therefor the following claims:

1. An automatic alignment system for aligning an object having an array of like patterns formed thereon, comprising:

moveable stage means for supporting an object to be aligned, said stage means being adjustable in the X, Y, Z and $\Theta$ directions in response to input control signals;

illumination means for illuminating the surface of said object;

first optical means having a first predetermined magnification and operative to focus an image of a first portion of the illuminated surface of said object along a first optical axis and onto an image plane;

second optical means having a second predetermined magnification substantially greater than said first magnification and operative to focus a second image of a second portion of said illuminated surface along a second optical axis and onto said image plane;

UNITED STATES PATENT AND TRADEMARK OFFICE
CERTIFICATE OF CORRECTION

PATENT NO. : 4,845,373
DATED : July 4, 1989
INVENTOR(S) : J. Jameison, M. Hsu It is certified that error appears in the above—identified patent and that said Letters Patent is hereby corrected as shown below:

image selector means for first selecting said first image and then selecting second image for focus onto said image plane;

optical detector means disposed at said image plane for converting said first image into first object data representing the image content of each pixel of said first image and then converting said second image into second object data representing the image content of each pixel of said second image;

means for developing a first set of reference image data corresponding to the light content of each pixel of a first reference image and for developing a second set of reference image data corresponding to the light content of each pixel of a second reference image;

comparison means for comparing said first object data to said first reference data and for developing first alignment correction signals proportional to differences therebetween, and for then comparing said second object data to said second reference data and for developing second alignment correction signals proportional to differences therebetween, and

UNITED STATES PATENT AND TRADEMARK OFFICE
CERTIFICATE OF CORRECTION

PATENT NO. : 4,845,373
DATED : July 4, 1989
INVENTOR(S) : J. Jameison, M. Hsu

It is certified that error appears in the above—identified patent and that said Letters Patent is hereby corrected as shown below:

alignment correction means responsive to said first correction signals and operative to move said stage means in said X, Y, Z and $\Theta$ directions as required to cause said comparison means to indicate that said first object data matches said first reference data, and then responsive to said second correction signals and operative to move said stage means in said X, Y, Z and $\Theta$ directions as required to cause said comparison means to indicate that said second object data matches said second reference data and that said object has been aligned.

2. An automatic alignment system as recited in claim 1 wherein said image selector means includes a moveable shutter disposed between said first and second optical means and said image plane and having a first aperture aligned with said first optical axis when said shutter is in one position, and a second optical aperture aligned with said second optical axis when said shutter is in a second position.

UNITED STATES PATENT AND TRADEMARK OFFICE
CERTIFICATE OF CORRECTION

Page 4 of 5

PATENT NO. : 4,845,373
DATED : July 4, 1989
INVENTOR(S) : J. Jameison, M. Hsu

It is certified that error appears in the above—identified patent and that said Letters Patent is hereby corrected as shown below:

3. An automatic alignment system as recited in claim 1 wherein said illumination means includes a first source of illumination for illuminating said first portion of said object and a second source of illumination for illuminating said second portion of said object.

Column 7;

4. An automatic alignment system as recited in claim 3 wherein said first optical axis intersects the surface of said object at a point remote from the point at which said second optical axis intersects said surface.

5. An automatic alignment system as recited in claim 1 and further comprising:

third optical means having said first predetermined magnification and operative to focus an image of a third portion of said surface remote from said first portion along a third optical axis and onto said image plane; and     fourth optical means having said second predetermined magnification and operation to focus an image of a fourth portion of said surface along a fourth optical axis and onto said image plane.

UNITED STATES PATENT AND TRADEMARK OFFICE
CERTIFICATE OF CORRECTION

PATENT NO. : 4,845,373
DATED : July 4, 1989
INVENTOR(S) : J. Jameison, M. Hsu

It is certified that error appears in the above—identified patent and that said Letters Patent is hereby corrected as shown below:

6. An automatic alignment system as recited in claim 1 wherein said optical detector means includes a video camera means for generating analog signals corresponding to the light content of each pixel of the image focused onto said image plane, and analog-to-digital conversion means for converting said analog signals into digital signals indicative of the light content of each said pixel.

Signed and Sealed this

Thirty-first Day of December, 1991

Attest:

HARRY F. MANBECK, JR.

Attesting Officer     Commissioner of Patents and Trademarks